United States Patent
Hsu et al.

(10) Patent No.: US 11,421,324 B2
(45) Date of Patent: Aug. 23, 2022

(54) HARDMASKS AND PROCESSES FOR FORMING HARDMASKS BY PLASMA-ENHANCED CHEMICAL VAPOR DEPOSITION

(71) Applicant: Applied Materials, Inc., Santa Clara, CA (US)

(72) Inventors: Jui-Yuan Hsu, San Jose, CA (US); Krishna Nittala, Sunnyvale, CA (US); Pramit Manna, Santa Clara, CA (US); Karthik Janakiraman, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/075,812

(22) Filed: Oct. 21, 2020

(65) Prior Publication Data

US 2022/0119953 A1   Apr. 21, 2022

(51) Int. Cl.
 *C23C 16/50* (2006.01)
 *H01J 37/32* (2006.01)
 (Continued)

(52) U.S. Cl.
 CPC .............. *C23C 16/50* (2013.01); *C23C 16/26* (2013.01); *C23C 16/4586* (2013.01);
 (Continued)

(58) Field of Classification Search
 CPC ..... C23C 16/50; C23C 16/26; C23C 16/4586; C23C 16/56; H01L 21/0332; H01L 21/0337
 See application file for complete search history.

(56) References Cited

U.S. PATENT DOCUMENTS 8,361,906 B2   1/2013   Lee et al.
9,240,320 B1   1/2016   Subramonium et al.
(Continued)

FOREIGN PATENT DOCUMENTS

EP    0855452      7/1998
JP    2009206394 A   9/2009
(Continued)

OTHER PUBLICATIONS

International Search Report and Written Opinion for Application No. PCT/US2020/033377 dated Sep. 1, 2020.
(Continued)

*Primary Examiner* — Kelly M Gambetta
(74) *Attorney, Agent, or Firm* — Patterson + Sheridan, LLP (57) ABSTRACT

Embodiments of the present disclosure generally relate to hardmasks and to processes for forming hardmasks by plasma-enhanced chemical vapor deposition (PECVD). In an embodiment, a process for forming a hardmask layer on a substrate is provided. The process includes introducing a substrate to a processing volume of a PECVD chamber, the substrate on a substrate support, the substrate support comprising an electrostatic chuck, and flowing a process gas into the processing volume within the PECVD chamber, the process gas comprising a carbon-containing gas. The process further includes forming, under plasma conditions, an energized process gas from the process gas in the processing volume, electrostatically chucking the substrate to the substrate support, depositing a first carbon-containing layer on the substrate while electrostatically chucking the substrate, and forming the hardmask layer by depositing a second carbon-containing layer on the substrate.

19 Claims, 4 Drawing Sheets

(51) Int. Cl.

| | | |
|---|---|---|
| *C23C 16/26* | (2006.01) | |
| *C23C 16/56* | (2006.01) | |
| *C23C 16/458* | (2006.01) | |
| *H01L 21/033* | (2006.01) | |
| *H01L 21/311* | (2006.01) | |

(52) U.S. Cl.
CPC ........ *C23C 16/56* (2013.01); *H01J 37/32449* (2013.01); *H01J 37/32715* (2013.01); *H01J 2237/3321* (2013.01); *H01L 21/0332* (2013.01); *H01L 21/0337* (2013.01); *H01L 21/31144* (2013.01)

(56) References Cited

U.S. PATENT DOCUMENTS

| | | | |
|---|---|---|---|
| 10,249,495 | B2 | 4/2019 | Yang et al. |
| 2001/0032591 | A1 | 10/2001 | Carducci et al. |
| 2004/0045934 | A1 | 3/2004 | Harvey et al. |
| 2004/0261720 | A1 | 12/2004 | Tolmachev et al. |
| 2005/0279624 | A1 | 12/2005 | Brcka |
| 2008/0277063 | A1 | 11/2008 | Shin |
| 2009/0212010 | A1 | 8/2009 | Wang et al. |
| 2012/0129351 | A1* | 5/2012 | Konecni ........... H01L 21/02274 438/703 |
| 2013/0008603 | A1 | 1/2013 | Eto et al. |
| 2014/0170853 | A1 | 6/2014 | Shamma et al. |
| 2015/0093908 | A1 | 4/2015 | Reddy et al. |
| 2015/0371851 | A1 | 12/2015 | Lee et al. |
| 2017/0040140 | A1 | 2/2017 | Tanaka et al. |
| 2017/0069464 | A1 | 3/2017 | Ye et al. |
| 2017/0103893 | A1 | 4/2017 | Kulshreshtha et al. |
| 2018/0358222 | A1* | 12/2018 | Venkatasubramanian .................. H01L 21/31111 |
| 2020/0370177 | A1 | 11/2020 | Franklin et al. |

FOREIGN PATENT DOCUMENTS

| | | |
|---|---|---|
| KR | 20120093721 A | 8/2012 |
| KR | 20120121340 A | 11/2012 |
| TW | 468209 B | 12/2001 |
| WO | 2006103333 A2 | 10/2006 |
| WO | 2019209433 A1 | 10/2019 |

OTHER PUBLICATIONS

International Search Report and Written Opinion dated Jan. 26, 2022 for Application No. PCT/US2021/053832.

\* cited by examiner

HARDMASKS AND PROCESSES FOR FORMING HARDMASKS BY PLASMA-ENHANCED CHEMICAL VAPOR DEPOSITION

BACKGROUND

Field

Embodiments of the present disclosure generally relate to hardmasks and to processes for forming hardmasks by plasma-enhanced chemical vapor deposition.

Description of the Related Art

Carbon-based hardmasks are typically employed for etch-resistant masks in patterning and line-width trimming applications due to, e.g., mechanical properties of the carbon-based hardmasks. Carbon-based hardmasks are typically fabricated by plasma-enhanced chemical vapor deposition (PECVD). Conventionally, the plasma conditions for forming such hardmasks employ argon and/or helium alone. Under plasma conditions, however, the high-energy bombardment of, e.g., argon and/or helium species, can damage the underlayer dielectric materials upon which the hardmask is formed, particularly during substrate chucking. Damage to the underlayer dielectric materials can result in the deterioration of device performance.

There is a need for new and improved processes that, e.g., mitigate underlayer damage during hardmask formation.

SUMMARY

Embodiments of the present disclosure generally relate to hardmasks and to processes for forming hardmasks by PECVD. Embodiments described herein reduce, or eliminate underlayer damage, during hardmask formation and improve adhesion between the hardmask and the substrate.

In an embodiment, a process for forming a hardmask layer on a substrate is provided. The process includes introducing a substrate to a processing volume of a PECVD chamber, the substrate on a substrate support, the substrate support comprising an electrostatic chuck, and flowing a process gas into the processing volume within the PECVD chamber, the process gas comprising a carbon-containing gas. The process further includes forming, under plasma conditions, an energized process gas from the process gas in the processing volume, electrostatically chucking the substrate to the substrate support, depositing a first carbon-containing layer on the substrate while electrostatically chucking the substrate, and forming the hardmask layer by depositing a second carbon-containing layer on the substrate.

In another embodiment, a process for forming a hardmask layer on a substrate is provided. The process includes introducing a substrate to a processing volume of a PECVD chamber, the substrate on a substrate support, the substrate support comprising an electrostatic chuck, and flowing a process gas into the processing volume within the PECVD chamber. The process gas includes a carbon-containing gas, wherein the carbon-containing gas comprises a carbon-containing compound or the carbon-containing gas is formed from a carbon-containing compound, and wherein the carbon-containing compound is a substituted or unsubstituted $C_1$-$C_{40}$ hydrocarbon, a substituted or unsubstituted $C_6$-$C_{20}$ aromatic hydrocarbon, a $C_1$-$C_{40}$ halogenated hydrocarbon, or a combination thereof. The process further includes forming, under plasma conditions, an energized process gas from the process gas in the processing volume, electrostatically chucking the substrate to the substrate support, depositing a first carbon-containing layer on the substrate while electrostatically chucking the substrate, and forming the hardmask layer by depositing a second carbon-containing layer on the substrate. The first carbon-containing layer, the second carbon-containing layer, or both, is deposited while the substrate is maintained at a temperature from about −40° C. to about 40° C., a pressure within the processing volume is from about 1 mTorr to about 20 mTorr, or a combination thereof.

In another embodiment, a process for forming a hardmask layer on a substrate is provided. The process includes introducing a substrate to a processing volume of a PECVD chamber, the substrate on a substrate support, the substrate support comprising an electrostatic chuck, and flowing a process gas into the processing volume within the PECVD chamber. The process gas includes a carbon-containing gas, wherein the carbon-containing gas comprises a carbon-containing compound or the carbon-containing gas is formed from a carbon-containing compound, the carbon-containing compound comprising a $C_1$-$C_{20}$ substituted or unsubstituted hydrocarbon. The process further includes forming, under plasma conditions, an energized process gas from the process gas in the processing volume, the plasma conditions comprising applying to the substrate support a RF bias power of about 200 W to about 5,000 W, electrostatically chucking the substrate to the substrate support, depositing a first carbon-containing layer on the substrate while electrostatically chucking the substrate, and forming the hardmask layer by depositing a second carbon-containing layer on the substrate. The first carbon-containing layer, the second carbon-containing layer, or both, is deposited while the substrate is maintained at a temperature from about −40° C. to about 40° C., a pressure within the processing volume is from about 1 mTorr to about 20 mTorr, or a combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

DETAILED DESCRIPTION

Embodiments of the present disclosure generally relate to hard masks and to processes for forming hardmasks by PECVD. The inventors have found new and improved processes and resultant hardmask structures that overcome one or more deficiencies of conventional methods for forming hardmasks. For example, embodiments described herein reduce substrate damage during hardmask formation and improve adhesion between the hardmask and the surface to which the hardmask is disposed on. Briefly, and in some examples, a substrate is electrostatically chucked to the substrate support in the presence of carbon-containing gases. A first carbon-containing layer is formed while electrostatically chucking the substrate. A hardmask layer is then formed by depositing a second carbon-containing layer (e.g., a diamond-like carbon (DLC) film or a film having a $sp^3$ fraction greater than 60%) on the substrate. The resultant carbon-containing layer prevents, or at least mitigates, underlayer damage caused by high energy bombardment of ions and reduces impingement of the wafer.

Conventional methods for the plasma strike (e.g., ignition) typically utilize a non-reactive gas alone (e.g., argon or helium), and the main deposition operation utilizes a precursor/carrier (e.g., acetylene/helium) mixture. As a result, the high-energy bombardment of ions impinge on the dielectric layer under the carbon hardmask, prior to the formation of carbon hardmask thereon. In contrast, embodiments described herein utilize a carbon-containing gas (with or without a non-reactive gas) to strike the plasma and form an initiation layer while electrostatically chucking the substrate. During the deposition operation, the carbon-containing gas (with or without a non-reactive gas) can be used to form the carbon hardmask. The wavy morphology of the resultant dielectric materials can be observed after the carbon-based hardmask is removed. In contrast, embodiments described herein eliminate, or at least mitigate, damage of the underlayer dielectric materials. Accordingly, embodiments described herein enable, e.g., improved device performance.

Figure 1:
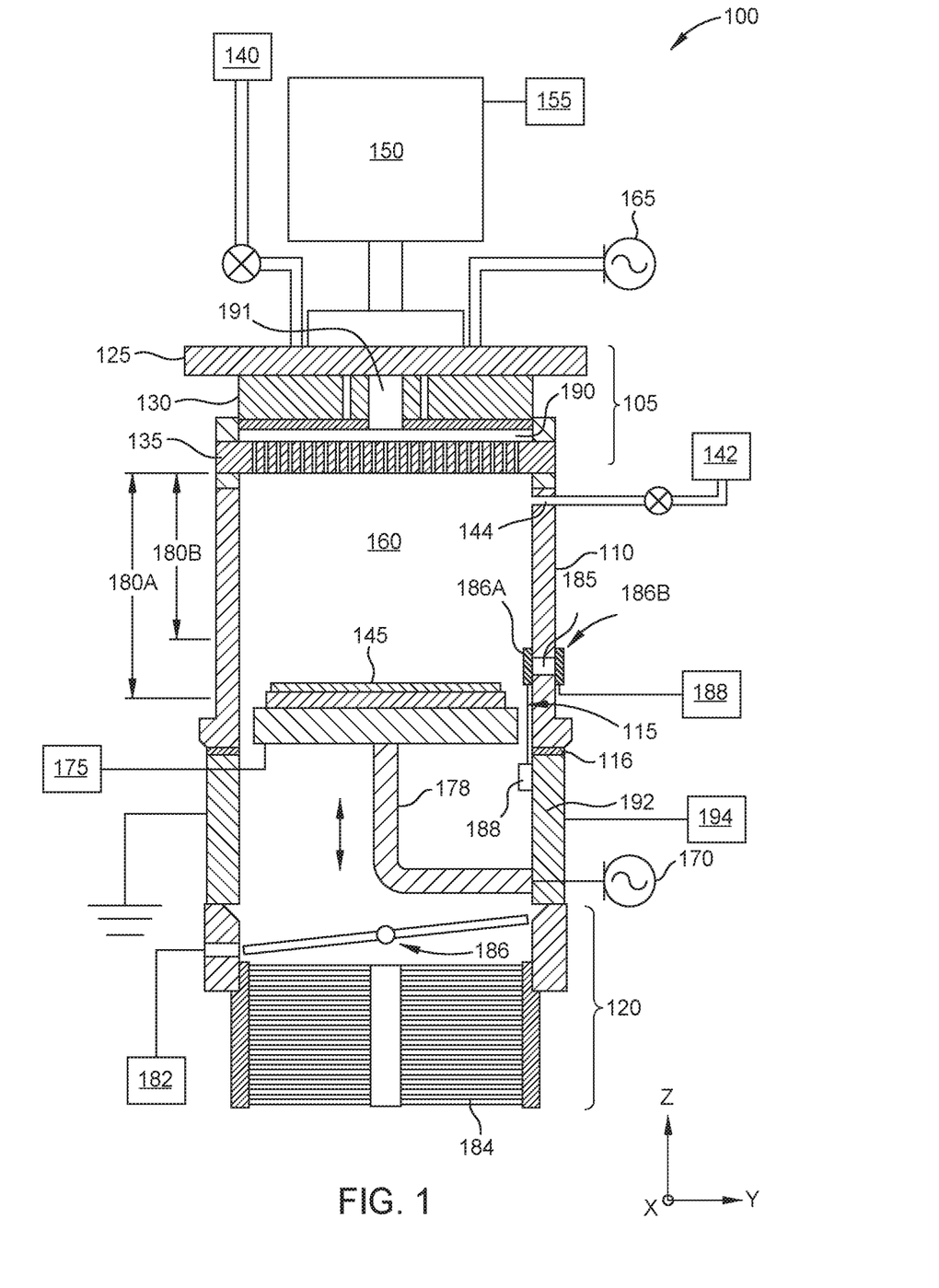
FIG. 1 is a schematic side cross sectional view of an example processing chamber according to at least one embodiment of the present disclosure.

FIG. 1 is a schematic side cross sectional view of an example processing chamber 100 suitable for conducting a deposition process according to at least one embodiment. Suitable chambers may be obtained from Applied Materials, Inc. located in Santa Clara, Calif. It is to be understood that the system described below is an exemplary processing chamber and other chambers, including chambers from other manufacturers, may be used with or modified to accomplish embodiments of the present disclosure (e.g., process 300 described below). In some embodiments, the processing chamber 100 may be configured to deposit advanced patterning films onto a substrate, such as hardmask films, for example amorphous carbon hardmask films.

The processing chamber 100 includes a lid assembly 105, a spacer 110 disposed on a chamber body 192, a substrate support 115, and a variable pressure system 120. The lid assembly 105 includes a lid plate 125 and a heat exchanger 130. In the embodiment shown, the lid assembly 105 also includes a showerhead 135. However, in other embodiments, the lid assembly 105 includes a concave or dome-shaped gas introduction plate.

The lid assembly 105 is coupled to a first processing gas source 140. The first processing gas source 140 contains precursor gases for forming films on a substrate 145 supported on the substrate support 115. As an example, the first processing gas source 140 includes precursor gases such as carbon-containing gases, hydrogen-containing gases, non-reactive gases (e.g., helium), among others. In a specific example, the carbon-containing gas includes acetylene ($C_2H_2$). The first processing gas source 140 provides precursors gases to a plenum 190 disposed in the lid assembly 105. The lid assembly includes one or more channels for directing precursor gases from the first processing gas source 140 into the plenum 190. From the plenum, the precursor gases flow through the showerhead 135 into a processing volume 160. In some embodiments, a second processing gas source 142 is fluidly coupled to the processing volume 160 via an inlet 144 disposed through the spacer 110. As an example, the second processing gas source 142 includes precursor gases such as carbon-containing gases, hydrogen-containing gases, non-reactive gases (e.g., helium), among others, for example $C_2H_2$. In some embodiments, a total flow rate of precursor gases into the processing volume 160 is about 100 sccm to about 2 slm. The flow of precursor gases in the processing volume 160 via the second processing gas source 142 modulates the flow of precursor gases flow through the showerhead 135 such that the precursor gases are uniformly distributed in the processing volume 160. In one example, a plurality of inlets 144 may be radially distributed about the spacer 110. In such an example, gas flow to each of the inlets 144 may be separately controlled to further facilitate gas uniformity within the processing volume 160.

The lid assembly 105 is also coupled to an optional remote plasma source 150. The optional remote plasma source 150 is coupled to a cleaning gas source 155 for providing cleaning gases to the processing volume 160 formed inside the spacer 110 between the lid assembly 105 and the substrate 145. In one example, cleaning gases are provided through a central conduit 191 formed axially through the lid assembly 105. In another example, cleaning gases are provided through the same channels which direct precursor gases. Example cleaning gases include oxygen-containing gases such as oxygen and/or ozone, as well fluorine containing gases such as $NF_3$, or combinations thereof.

In addition to or as an alternative to the optional remote plasma source 150, the lid assembly 105 is also coupled to a first or upper radio frequency (RF) power source 165. The first RF power source 165 facilitates maintenance or generation of plasma, such as a plasma generated from a cleaning gas. In one example, the optional remote plasma source 150 is omitted, and the cleaning gas is ionized into a plasma in situ via the first RF power source 165. The substrate support 115 is coupled to a second or lower RF power source 170. The first RF power source 165 may be a high frequency RF power source (for example, about 13.56 MHz to about 120 MHz) and the second RF power source 170 may be a low frequency RF power source (for example, about 2 MHz to about 13.56 MHz). It is to be noted that other frequencies are also contemplated. In some implementations, the second RF power source 170 is a mixed frequency RF power source, providing both high frequency and low frequency power. Utilization of a dual frequency RF power source, particularly for the second RF power source 170, improves film deposition. In some examples, utilizing a second RF power source 170 provides dual frequency powers. In some embodiments, a first frequency of, e.g., about 2 MHz to about 13.56 MHz, improves the implantation of species into the deposited film, while a second frequency of, e.g., about 13.56 MHz to about 120 MHz, and increases ionization and deposition rate of the film.

One or both of the first RF power source 165 and the second RF power source 170 can be utilized in creating or maintaining a plasma in the processing volume 160. For example, the second RF power source 170 may be utilized during a deposition process and the first RF power source 165 may be utilized during a cleaning process (alone or in conjunction with the optional remote plasma source 150). In some deposition processes, the first RF power source 165 is used in conjunction with the second RF power source 170. During a deposition or etch process, one or both of the first RF power source 165 and the second RF power source 170 can provide a power of, e.g., about 100 Watts (W) to about 20,000 W in the processing volume 160 to facilitation ionization of a precursor gas. In some embodiments, at least one of the first RF power source 165 and the second RF power source 170 are pulsed. In at least one embodiment, RF power is applied to the lid plate 125.

The substrate support 115 is coupled to an actuator 175 (i.e., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 110 is disposed on the chamber body 192. A height of the spacer 110 allows movement of the substrate support 115 vertically within the processing volume 160. The height of the spacer 110 is about 0.5 inches to about 20 inches. In one example, the substrate support 115 is movable from a first distance 180A to a second distance 180B relative to the lid assembly 105 (for example, relative to a lower surface of the showerhead 135). In some embodiments, the second distance 180B is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the showerhead 135. In another example, the substrate support 115 is fixed at one of the first distance 180A and the second distance 180B. In contrast to conventional plasma-enhanced chemical vapor deposition (PECVD) processes, the spacer 110 greatly increases the distance between (and thus the volume between) the substrate support 115 and the lid assembly 105. The increased distance between the substrate support 115 and the lid assembly 105 reduces collisions of ionized species in the processing volume 160, resulting in deposition of film with less neutral stress, such as less than 2.5 gigapascal (GPa). Films deposited with less neutral stress facilitate improved planarity (e.g., less bowing) of substrates upon which the film is formed. Reduced bowing of substrates results in improved precision of downstream patterning operations.

The variable pressure system 120 includes a first pump 182 and a second pump 184. The first pump 182 is a roughing pump that may be utilized during a cleaning process and/or substrate transfer process. A roughing pump is generally configured for moving higher volumetric flow rates and/or operating a relatively higher (though still sub-atmospheric) pressure. In a non-limiting example, the first pump 182 maintains a pressure within the processing chamber of less than about 500 mTorr, such as less than about 50 mtorr during a cleaning process. In another example, the first pump 182 maintains a pressure within the processing chamber 100 of, e.g., less than about 500 mTorr, such as less than about 50 mTorr, such as from about 0.5 mtorr to about 10 Torr or from about 5 mTorr to about 15 mTorr. Utilization of a roughing pump during cleaning operations facilitates relatively higher pressures and/or volumetric flow of cleaning gas (as compared to a deposition operation). The relatively higher pressure and/or volumetric flow during the cleaning operation improves cleaning of chamber surfaces.

The second pump 184 may be one a turbo pump and a cryogenic pump. The second pump 184 can be utilized during a deposition process. The second pump 184 is generally configured to operate a relatively lower volumetric flow rate and/or pressure. In a non-limiting example, the second pump 184 is configured to maintain the processing volume 160 of the process chamber at a pressure of less than about 500 mTorr, such as less than about 50 mtorr. In another example, the second pump 184 maintains a pressure within the processing chamber 100 of, e.g., less than about 500 mTorr, such as less than about 50 mTorr, such as from about 0.5 mtorr to about 10 Torr or from about 5 mTorr to about 15 mTorr. The reduced pressure of the processing volume 160 maintained during deposition facilitates deposition of a film having reduced neutral stress and/or increased $sp^2$-$sp^3$ conversion, when depositing carbon-based hardmasks. Thus, process chamber 100 is configured to utilize both relatively lower pressure to improve deposition and relatively higher pressure to improve cleaning.

In some embodiments, both of the first pump 182 and the second pump 184 are utilized during a deposition process to maintain the processing volume 160 of the process chamber at a pressure of less than about 500 mTorr, such as less than about 50 mTorr. In other embodiments, the first pump 182 and the second pump 184 maintain the processing volume 160 at a pressure of, e.g., from about 0.5 mtorr to about 10 Torr or from about 5 mTorr to about 15 mTorr. A valve 186 is utilized to control the conductance path to one or both of the first pump 182 and the second pump 184. The valve 186 also provides symmetrical pumping from the processing volume 160.

The processing chamber 100 also includes a substrate transfer port 185. The substrate transfer port 185 is selectively sealed by an interior door 186A and an exterior door 186B. Each of the doors 186A and 186B are coupled to actuators 188 (i.e., a door actuator). The doors 186A and 1866 facilitate vacuum sealing of the processing volume 160. The doors 186A and 186B also provide symmetrical RF application and/or plasma symmetry within the processing volume 160. In one example, at least the door 186A is formed of a material that facilitates conductance of RF power, such as stainless steel, aluminum, or alloys thereof. Seals 116, such as O-rings, disposed at the interface of the spacer 110 and the chamber body 192 may further seal the processing volume 160. A controller 194 coupled to the processing chamber 100 is configured to control aspects of the processing chamber 100 during processing.

Figure 2A:
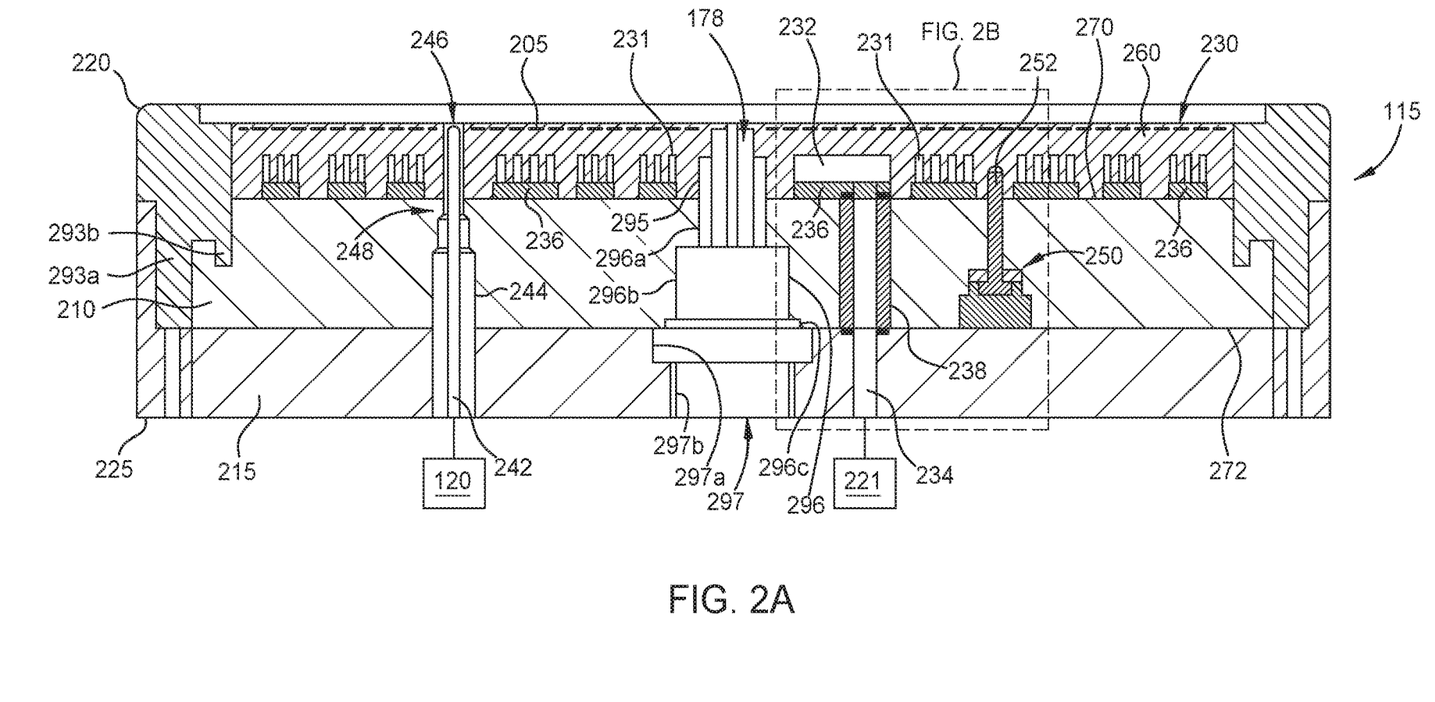
FIG. 2A is a schematic sectional view an example substrate support according to at least one embodiment of the present disclosure.
Figure 2B:
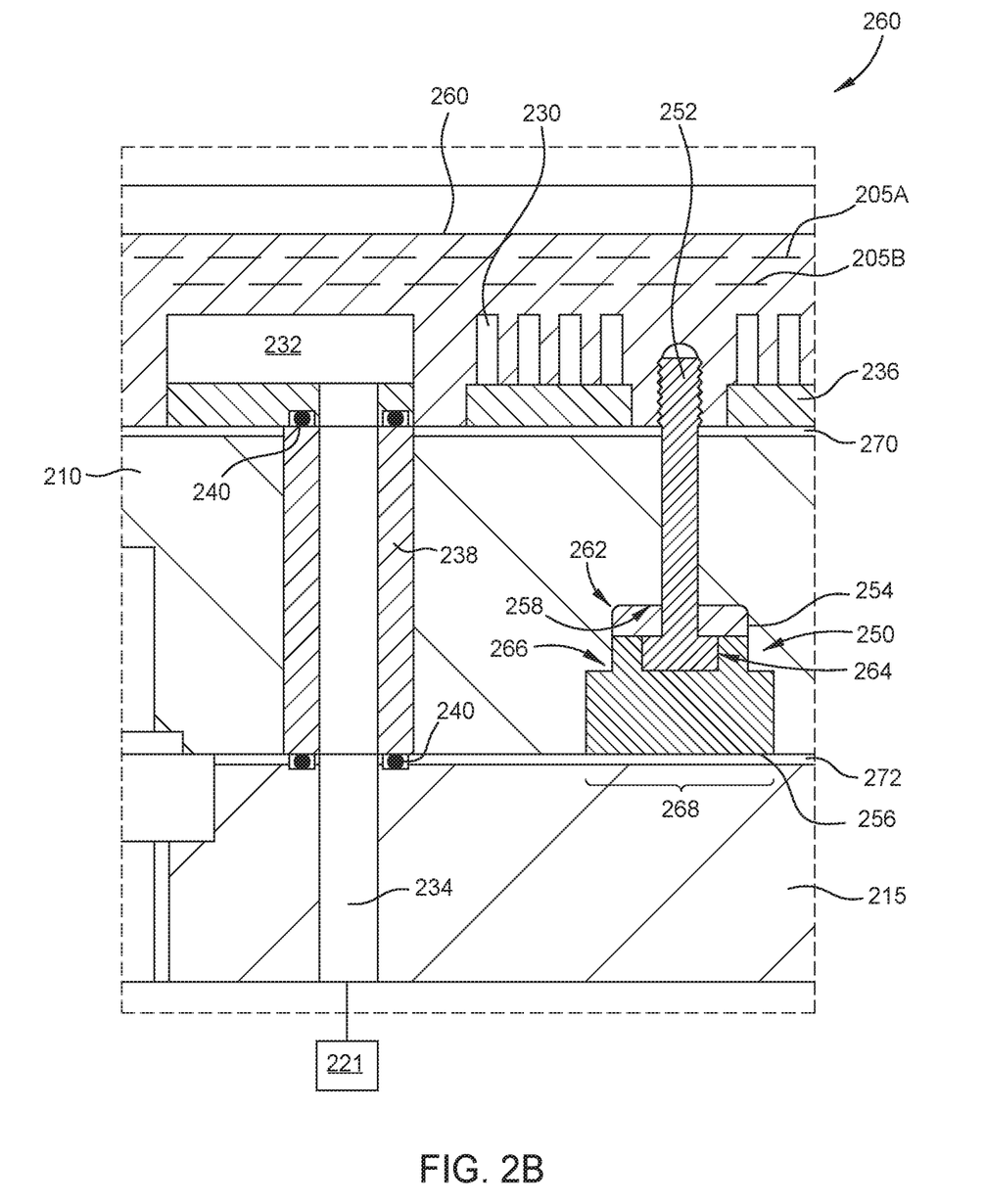
FIG. 2B is an enlarged sectional view of a portion of the example substrate support shown in FIG. 2A according to at least one embodiment of the present disclosure.

FIG. 2A is a schematic sectional view of one embodiment of the substrate support 115. FIG. 2B is an enlarged sectional view of a portion of the substrate support 115 shown in FIG. 2A. As described above, the substrate support 115 can include an electrostatic chuck 230. The electrostatic chuck 230 includes a puck 260. The puck 260 includes one or more electrodes 205 embedded therein (a first electrode 205A and a second electrode 205B is shown in FIG. 2B). The first electrode 205A is utilized as a chucking electrode and the second electrode 205B is utilized as an RF biasing electrode. The substrate support 115 may be biased by providing RF power at a frequency of, e.g., about 300 kHz to about 120 MHz, such as from about 300 kHZ to about 60 MHz, to the second electrode 205B. The frequency provided to the second electrode 205B may be pulsed. The puck 260 is typically formed from a dielectric material, such as a ceramic material, for example aluminum nitride (AlN).

The puck 260 is supported by a dielectric plate 210 and a base plate 215. The dielectric plate 210 may be formed from an electrically insulative material, such as quartz, or a thermoplastic material, such as high performance plastics sold under the tradename REXOLITE®. The base plate 215 may be made from a metallic material, such as aluminum. During operation, the base plate 215 is coupled to ground or is electrically floating while the puck 260 is RF hot. At least the puck 260 and the dielectric plate 210 are surrounded by an insulator ring 220. The insulator ring 220 may be made of a dielectric material such as quartz, silicon, or a ceramic material. The base plate 215 and a portion of the insulator ring 220 is surrounded by a ground ring 225 made of aluminum. The insulator ring 220 prevents or minimizes arcing between the puck 260 and the base plate 215 during operation. An end of the facilities cable 178 is shown in openings formed in the puck 260, the dielectric plate 210 and the base plate 215. Power for the electrodes of the puck 260, as well as fluids from a gas supply (not shown) to the substrate support 115, is provided by the facilities cable 178.

An edge ring (not shown) is disposed adjacent to an inner circumference of the insulator ring 220. The edge ring may comprise a dielectric material, such as quartz, silicon, cross-linked polystyrene and divinylbenzene (e.g., REXOLITE®), PEEK, $Al_2O_3$, AlN, among others. Utilizing an edge ring comprising such a dielectric material helps modulate the plasma coupling, modulating the plasma properties, such as the voltage on the substrate support ($V_{dc}$), without having to change the plasma power, thus improving the properties of the hardmask films deposited on substrates. By modulating the RF coupling to the wafer or substrate through the material of the edge ring, the modulus of the film can be decoupled from the stress of the film.

Each of the puck 260, the dielectric plate 210, and the base plate 215 include a respectively axially aligned opening formed therein or therethrough for accommodating the facilities cable 178. The puck 260 includes an opening 295 shaped to engage the facilities cable 178. For example, the opening 295 may be configured as a female receptacle for receiving the facilities cable 178. The dielectric plate 210 includes an opening 296 axially aligned with the opening 295. The opening 296 includes an upper portion 296a having a diameter about equal to the diameter of the opening 295, a middle portion 296b having a diameter with a diameter greater than the diameter of the upper portion, and a lower portion 296c having a diameter greater than a diameter of the middle portion 296b. The base plate 215 includes an opening 297 having an upper portion 297a with a first diameter and a lower portion 297b with a second diameter less than the first diameter. The multiple diameters of the openings 296 and 297 can facilitate securing of the facilities cable 178 therein.

The puck 260 includes a plurality of fluid channels 231 formed therein. Each of the fluid channels 231 are in fluid communication with an inlet channel 232. The inlet channel 232 is fluidly coupled to an inlet conduit 234. The inlet conduit 234 is coupled to the coolant source 221. Each of the fluid channels 231 and the inlet channel 232 are sealed by a cap plate 236. The cap plates 236 may be made of the same material as the puck 260, or aluminum, and can be welded or otherwise bonded to the puck 260 to seal the fluid channels 231 and the inlet conduit 234. While not shown, an outlet conduit, similar to the inlet conduit 234, is provided in the substrate support 115 such that the cooling fluid can be recirculated therein.

A portion of the inlet conduit 234 is formed by a tubular member 238. The tubular member 238 is formed from a dielectric material such as ceramic materials. Seals 240 are provided at ends of the tubular member 238 adjacent to the cap plates 236 and the base plate 215. The tubular member 238 prevents arcing that may be caused by the cooling fluid flowing therethrough. The tubular member 238 may also thermally insulate the dielectric plate 210 from the relatively cold cooling fluid flowing therein in order to prevent cracking of the dielectric plate 210.

The substrate support 115 also includes a plurality of lift pins 242 (only one is shown in FIG. 2A). Each of the lift pins 242 are movably disposed in a dielectric bushing 244. Each of the lift pins 242 may be formed from a ceramic material, such as AlN, sapphire, quartz, or the like. The dielectric bushing 244 is provided in or through each of the puck 260, the dielectric plate 210 and the base plate 215. The dielectric bushing 244 is made of a polymer material, such as a polytetrafluoroethylene (PTFE) material. The dielectric bushing 244 includes an opening 246 along the length direction thereof where the lift pin 242 is guided. The opening 246 is sized slightly larger than the dimension (diameter) of the lift pin 242 such that a conductance path is formed in the dielectric bushing 244. For example, the opening 246 is coupled to the variable pressure system 120 such that vacuum conductance is provided between the processing volume 160 and through the dielectric bushing 244 to the variable pressure system 120. The conductance path provided by the opening 246 prevents arcing of the lift pins. The dielectric bushing 244 includes a plurality of steps 248 which are varied diameter sections. The steps 248 reduce arcing between the puck 260 and the base plate 215 by increasing the length of the path electricity may travel, as well as by introducing angular turns along the path.

The substrate support 115 also includes a plurality of fastener devices 250 (only one is shown). The fastener devices 250 are utilized to attach the puck 260 to the dielectric plate 210. Each fastener device 250 includes a fastener 252, a washer 254 and a fastener cap 256 (the washer 254 and fastener cap 256 are shown in FIG. 2B). When the fastener 252 is tightened, the washer 254 is urged against a surface 258 of an opening 268 formed in the dielectric plate 210. The washer 254 and the fastener 252 are made from a metallic material, such as stainless steel. The washer 254 includes a rounded upper corner 262. The rounded upper corner 262 prevents cracking of the material of the dielectric plate 210 when the fastener 252 is tightened.

The fastener cap 256 is utilized to fill the remainder of the opening 268 in the dielectric plate 210. The fastener cap 256 includes a pocket 264 that is sized to receive the head of the fastener 252. The fastener cap 256 is formed from a dielectric material, such as a polymer, for example, polyether ether ketone (PEEK). The outer surface of the fastener cap 256 includes a step 266. The step 266 reduces arcing between the puck 260 and the base plate 215 by increasing the length of the path electricity may travel.

The substrate support 115 also includes a plurality of gaps between layers thereof. A first gap 270 is provided between the puck 260 and the dielectric plate 210. A second gap 272 is provided between the dielectric plate 210 and the base plate 215. The first gap 270 and the second gap 272 are in fluid communication with a gas supply (not shown). Fluids from the gas supply can be flown in the first gap 270 and the second gap 272 to prevent condensation between adjacent layers. Fluids in the first gap 270 and the second gap 272 are sealed on ends of the substrate support 115 by the edge ring. The edge ring may be sized to provide a controlled leakage of fluids from the first gap 270 and the second gap 272.

Methods

Embodiments of the present disclosure generally relate to methods of processing a substrate, such as processes for forming a hardmask layer on a substrate. Conventional methods typically use a gas mixture of argon and/or helium during the plasma strike, leading to underlayer damage. In contrast, the embodiments described herein utilize a carbon-containing gas (with or without a non-reactive gas) to strike the plasma to form an intermediate/initiation layer on the substrate while electrostatically chucking the substrate. This intermediate layer formation operation using a low RF bias power prevents Ar ion bombardment into the underlayer during pre-chuck, and serves as a blocking (intermediate/initiation) layer to prevent the high-energy bombardment of $CH_2+$ ions during deposition as determined by transmission electron microscope images. Due to, e.g., the lower RF bias power used during the intermediate layer formation operation relative to the main deposition operation, the $CH_2+$ ions also do not negatively impact the underlayer. During the main deposition operation, the carbon-containing gas (with or without a non-reactive gas) can also be utilized to form the carbon hardmask. Further, the resultant hardmask film properties are not affected by this thin carbon-containing initiation layer (formed in the plasma strike). Typically, the carbon-containing initiation layer has lower $sp^3$ content than the layer formed from the main deposition operation and the thickness is less than about 100 Å. In addition, the plasma strike using carbon-containing gas, with or without a non-reactive gas, can help mitigate the underlayer damage. As described below, the chucking/initiation layer is formed at a lower RF bias power than the main deposition operation.

Figure 3:
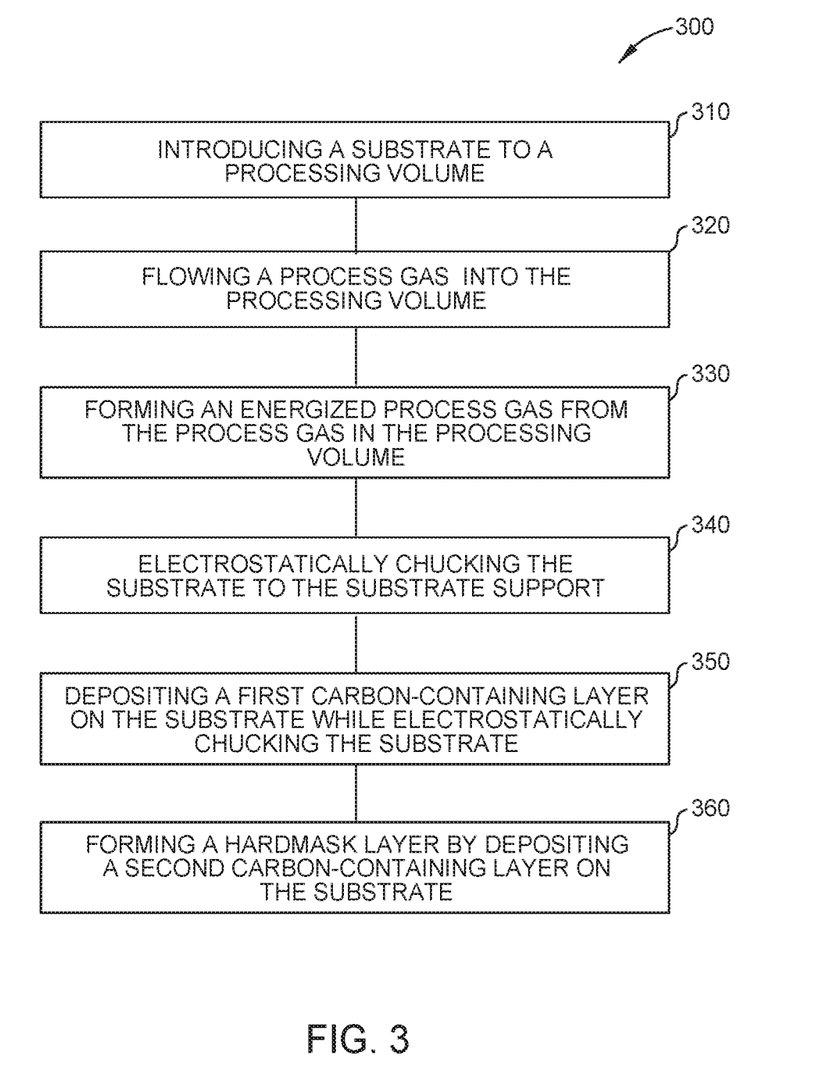
FIG. 3 is a flowchart showing selected operations of an example method of processing a substrate according to at least one embodiment of the present disclosure To facilitate understanding, identical reference numerals have been used, where possible, to designate identical elements that are common to the figures. It is contemplated

FIG. 3 is a flowchart showing selected operations of an example process 300 for forming a hardmask layer on a substrate a substrate according to at least one embodiment of the present disclosure. The process eliminates (or at least mitigates) underlayer damage during the formation of carbon hardmasks, and improves adhesion between the hardmask and the underlayer to which the hardmask is formed upon.

The process 300 includes introducing (e.g., transferring, conveying, etc.) the substrate to a processing region of a substrate processing chamber at operation 310. As an example, the substrate, e.g., substrate 145, is transferred into the processing chamber 100 and onto the substrate support 115 by any suitable means, such as by substrate transfer port 185. The substrate support 115 can be adjusted to a processing position by an actuator 175 as depicted in FIG. 1. The substrate support 115 includes an electrostatic chuck, such as electrostatic chuck 230. The substrate can include one or more materials such as nitride, oxide, silicon, and/or a metal (e.g., tungsten, molybdenum, titanium, etc.).

The process 300 further includes flowing one or more process gases into the processing volume within the PECVD chamber at operation 320. As an example, the one or more process gases from one or more sources are provided to the processing volume 160 through, e.g., showerhead 135 such that the one or more process gases is uniformly distributed in the processing volume 160. In one example, a plurality of inlets 144 may be radially distributed about the spacer 110, and gas flow to each of the plurality of inlets 144 may be separately controlled to further facilitate gas uniformity within the processing volume 160.

The process gas includes one or more carbon-containing compounds. Additionally, or alternatively, the process gas is formed from one or more carbon-containing compounds. For example, compounds that are not in a gas state at standard temperature and pressure can be converted to a carbon-containing gas. Accordingly, and in some examples, the carbon-containing gas comprises a carbon-containing compound, or the carbon-containing gas is formed from a carbon-containing compound, or a combination thereof.

Non-limiting examples of carbon-containing compounds include hydrocarbons, aromatic hydrocarbons, and halogenated compounds, among others. In some embodiments, the carbon-containing compound have a carbon number of, e.g., $C_1$-$C_{100}$, such as $C_1$-$C_{40}$, such as $C_1$-$C_{20}$, such as $C_1$-$C_{10}$. The carbon-containing compounds can be linear or branched, cyclic or acyclic, and/or substituted or unsubstituted. Substituted refers to a carbon-containing compound in which at least one hydrogen atom of the carbon-containing compound has been substituted with at least one heteroatom (such as a halogen, e.g., fluorine (F), chlorine (Cl), bromine (Br), and/or iodine (I)) or heteroatom-containing group (such as a functional group, e.g., $—NR^*_2$, $—OR^*$, $—SiR^*_3$, $—GeR^*_3$, where each $R^*$ is independently hydrogen or a hydrocarbon that is linear or branched, cyclic or acyclic, substituted or unsubstituted).

Non-limiting examples of hydrocarbons include, but are not limited to, alkanes having an empirical formula $C_nH_{2n+2}$, alkenes having an empirical formula $C_nH_{2n}$, and alkynes having an empirical formula $C_nH_{2n-2}$. Each of the alkanes, alkenes, and alkynes can be linear or branched, cyclic or acyclic, aromatic or non-aromatic, substituted or unsubstituted. Non-limiting examples of alkanes include, e.g., methane, ethane, and isomers of propane, butane, pentane, hexane, heptane, octane, nonane, decane, undecane, dodecane, tridecane, tetradecane, pentadecane, hexadecane, heptadecane, octadecane, nonadecane, and icosane. Non-limiting examples of alkenes include, e.g., ethene, and isomers of propene, butene, pentene, hexene, heptene, octene, nonene, decene, undecene, dodecene, tridecene, tetradecene, pentadecene, hexadecene, heptadecene, octadecene, nonadecene, and icosene. Non-limiting examples of alkynes include, e.g., such as acetylene, and isomers of propyne, butyne, pentyne, hexyne, heptyne, octyne, nonyne, decyne, undecyne, dodecyne, tridecyne, tetradecyne, pentadecyne, hexadecyne, heptadecyne, octadecyne, nonadecyne, and icosyne.

Non-limiting examples of aromatic hydrocarbons include, but are not limited to, $C_4$-$C_{30}$ aromatic hydrocarbons, such as $C_6$-$C_{20}$ aromatic hydrocarbons, such as benzene, toluene, xylene, and naphthalene. The aromatic hydrocarbons can be unsubstituted or substituted, where at least one hydrogen atom of the aromatic hydrocarbon has been substituted with at least one heteroatom (such as a halogen, e.g., F, Cl, Br, and/or I) or a heteroatom-containing group (such as a functional group, e.g., $—NR^*_2$, $—OR^*$, $—SiR^*_3$, $—GeR^*_3$, where each $R^*$ is independently hydrogen or a hydrocarbon that is linear or branched, cyclic or acyclic, substituted or unsubstituted).

Non-limiting examples of halogenated compounds include, but are not limited to, compounds having an empirical formula $C_nH_xX'_{(2n+2-x)}$, where X'=F, Cl, Br, and/or I, and n=1-100 (such as 1 to 40, such as 1 to 30, such as 1 to 20, such as 1 to 10, such as 1 to 6). Illustrative, but non-limiting, examples of halogenated compounds include $CF_4$, $CH_2F_2$, $C_4F_6$, or a combination thereof.

In some embodiments, the process gas further includes one or more non-reactive gases. Illustrative, but non-limiting, examples of non-reactive gases include helium (He), neon (Ne), argon (Ar), krypton (Kr), xenon (Xe), radon (Rn), or a combination thereof.

The process 300 further includes forming an energized process gas from the process gas at operation 330. The energized process is generated by plasma under plasma conditions. Here, for example, RF power source 165 and/or RF power source 170 can supply RF power at any suitable frequency or power level for plasma generation. The RF power creates an electromagnetic field that energizes the process gas within the processing volume 160. Non-limiting examples of process conditions for generating plasma are provided below.

The process 300 further includes electrostatically chucking the substrate to the substrate support at operation 340, and depositing a first carbon-containing layer on the substrate while electrostatically chucking the substrate at operation 350. A hardmask layer is then formed by depositing a second carbon-containing layer on the substrate at operation 360. The first carbon-containing layer can serve as a blocking (intermediate/initiation) layer to prevent high energy bombardment of $C_2H+$ ion during the main deposition step of operation 360.

Various operations of the example processes described herein (e.g., process 300) include one or more process parameters as described below.

A temperature of the substrate can have a temperature of about 100° C. or less, such as from about −40° C. to about 100° C., such as from about −30° C. to about 50° C. or from about −40° C. to about 10° C. In at least one embodiment, the temperature of the substrate ranges from $T_1$ to $T_2$ (in units of ° C.), where each of $T_1$ and $T_2$ is independently about −40, about −35, about −30, about −25, about −20, about −15, about −10, about −5, about 0, about 5, about 10, about 15, about 20, about 25, about 30, about 35, about 40, about 45, about 50, about 55, about 60, about 65, about 70, about 75, about 80, about 85, about 90, about 95, or about 100, as long as $T_1<T_2$.

A pressure within the processing volume can be about 500 millitorr (mTorr) or less, such as about 400 mTorr or less, such as about 300 mTorr or less, such as about 200 mTorr or less, such as about 100 mTorr or less, such as about 50 mTorr or less, such as about 20 mTorr or less, such as from about 1 mTorr to about 10 mTorr, from about 4 mTorr to about 10 mTorr, or from about 5 mTorr to about 15 mTorr. In at least one embodiment, the pressure within the processing volume ranges from $P_1$ to $P_2$ (in units of mTorr), where each of $P_1$ and $P_2$ is independently about 0.5 mTorr, about 1, about 2, about 3, about 4, about 5, about 6, about 7, about 8, about 9, about 10, about 11, about 12, about 13, about 14, about 15, about 16, about 17, about 18, about 19, about 20, about 25, about 50, about 100, about 200, about 300, about 400, or about 500, as long as $P_1<P_2$.

A flow rate of the one or more carbon-containing gases into the processing volume can be about 5,000 standard cubic centimeters per minute (sccm) or less, such as from about 20 sccm to about 5,000 sccm for a 300 mm-sized substrate, such as from about 50 sccm to about 200 sccm, such as from about 80 sccm to about 160 sccm. In at least one embodiment, the flow rate of the one or more carbon-containing gases for a 300 mm-sized substrate ranges from flow rate$_1$ to flow rate$_2$ (in units of sccm), where each of flow rate$_1$ and flow rate$_2$ is independently about 20, about 30, about 40, about 50, about 60, about 70, about 80, about 90, about 100, about 110, about 120, about 130, about 140, about 150, about 160, about 170, about 180, about 190, about 200, about 210, about 220, about 230, about 240, about 250, about 500, about 1,000, about 1,500, about 2,000, about 2,500, about 3,000, about 3,500, about 4,000, about 4,500, or about 5,000, as long as flow rate$_1$<flow rate$_2$.

In embodiments where one or more non-reactive gases is used, a flow rate of the one or more non-reactive gases into the processing volume can be about 3,000 sccm or less for a 300 mm-sized substrate, such as about 500 sccm or less, such as about 250 sccm or less, such as from about 0 sccm to about 100 sccm, such as from about 1 to about 50 sccm. In at least one embodiment, the flow rate of the one or more non-reactive gases for a 300 mm-sized substrate ranges from flow rate$_3$ to flow rate$_4$ (in units of sccm), where each of flow rate$_3$ and flow rate$_4$ is independently about 0, about 1, about 5, about 10, about 20, about 30, about 40, about 50, about 60, about 70, about 80, about 90, about 100, about 110, about 120, about 130, about 140, about 150, about 160, about 170, about 180, about 190, about 200, about 210, about 220, about 230, about 240, about 250, about 500, about 1,000, about 1,500, about 2,000, about 2,500, or about 3,000, as long as flow rate$_3$<flow rate$_4$.

In embodiments where one or more non-reactive gases is used, a flow rate ratio of carbon-containing gas(es) to non-reactive gas(es) for a 300 mm-sized substrate can be about 0.05 or more, such as from about 0.1 to about 100, such as from about 0.5 to about 50, such as from about 1 to about 10. In at least one embodiment, the flow rate ratio of carbon-containing gas(es) to non-reactive gas(es) for a 300 mm-sized substrate ranges from ratio$_1$ to ratio$_2$ where each of ratio$_1$ to ratio$_2$ is independently about 0.1, about 0.2, about 0.3, about 0.4, about 0.5, about 1, about 2, about 5, about 10, about 15, about 20, about 25, about 30, about 35, about 40, about 45, about 50, about 55, about 60, about 65, about 70, about 75, about 80, about 85, about 90, about 95, or about 100, so long as ratio$_1$<ratio$^2$.

An RF source power applied to the lid plate (e.g., lid plate 125) can be from about 100 Watts (W) to about 10,000 W, such as from about 500 W to about 5,000 W, such as from about 1,000 W to about 2,000 W or from about 2,500 W to about 4,000 W. In at least one embodiment, the RF power ranges from power$_1$ to power$_2$ (in units of W) where each of power$_1$ and power$_2$ is independently about 100, about 200, about 300, about 400, about 500, about 600, about 700, about 800, about 900, about 1,000, about 1,500, about 2,000, about 2,500, about 2,600, about 2,700, about 2,800, about 2,900, about 3,000, about 3,100, about 3,200, about 3,300, about 3,400, about 3,500, about 3,600, about 3,700, about 3,800, about 3,900, about 4,000, about 4,500, about 5,000, about 5,500, about 6,000, about 6,500, about 7,000, about 7,500, about 8,000, about 8,500, about 9,000, about 9,500, or about 10,000 W, so long as power$_1$<power$_2$.

An RF bias power applied to the substrate support during deposition can be from about 100 Watts (W) to about 10,000 W, such as from about 500 W to about 5,000 W, such as from about 1,000 W to about 2,000 W or from about 2,500 W to about 4,000 W. In at least one embodiment, the RF bias power during deposition ranges from power$_3$ to power$_4$ (in units of W) where each of power$_3$ and power$_4$ is independently about 100, about 200, about 300, about 400, about 500, about 600, about 700, about 800, about 900, about 1,000, about 1,500, about 2,000, about 2,500, about 2,600, about 2,700, about 2,800, about 2,900, about 3,000, about 3,100, about 3,200, about 3,300, about 3,400, about 3,500, about 3,600, about 3,700, about 3,800, about 3,900, about 4,000, about 4,500, about 5,000, about 5,500, about 6,000, about 6,500, about 7,000, about 7,500, about 8,000, about 8,500, about 9,000, about 9,500, or about 10,000, so long as $power_3<power_4$.

An RF bias power during the plasma strike can be from about 100 Watts (W) to about 1,000 W, such as from about 100 W to about 800 W, such as from about 200 W to about 500 W. In at least one embodiment, the RF bias power during the plasma strike ranges from $power_5$ to $power_6$ (in units of W) where each of $power_5$ and $power_6$ is independently about 10, about 50, about 100, about 150, about 200, about 250, about 300, about 350, about 400, about 450, about 500, about 550, about 600, about 650, about 700, about 750, about 800, about 850, about 900, about 850, or about 1,000, so long as $power_5<power_6$.

The substrate support may be biased by providing an RF power at a frequency of at least about 300 kHz, such as from about 400 kHz to about 120 MHz or from about 300 kHz to about 60 MHz, such as from about 1 MHz such as from about 10 MHz. The frequency can be pulsed.

The plasma employed can have a plasma density on the order of about 10 ions/cm$^3$ or more, such as from about 100 ions/cm$^3$ to about $1\times10^{15}$ ions/cm$^3$, such as from about $1\times10^7$ ions/cm$^3$ to about $1\times10^{15}$ ions/cm$^3$, such as from about $1\times10^8$ ions/cm$^3$ to about $1\times10^{14}$ ions/cm$^3$, such as from about $1\times10^9$ ions/cm$^3$ to about $1\times10^{13}$ ions/cm$^3$, such as from about $1\times10^{10}$ ions/cm$^3$ to about $1\times10^{12}$ ions/cm$^3$. In at least one embodiment, the plasma density (PD) ranges from $time_1$ to $time_2$ (in units of s) where each of $PD_1$ and $PD_2$ is independently about 1 ions/cm$^3$, about 10 ions/cm$^3$, about 100 ions/cm$^3$, about $1\times10^3$ ions/cm$^3$, about $1\times10^4$ ions/cm$^3$, about $1\times10^5$ ions/cm$^3$, about $1\times10^6$ ions/cm$^3$, about $1\times10^7$ ions/cm$^3$, about $1\times10^8$ ions/cm$^3$, about $1\times10^9$ ions/cm$^3$, about $1\times10^{10}$ ions/cm$^3$, about $1\times10^{11}$ ions/cm$^3$, about $1\times10^{12}$ ions/cm$^3$, about $1\times10^{13}$ ions/cm$^3$, about $1\times10^{14}$ ions/cm$^3$, or about $1\times10^{15}$ ions/cm$^3$, so long as $PD_1<PD_2$. The plasma density can be measured in the processing region of the substrate processing chamber.

A deposition time of the carbon-containing layer can be about 1 second (s) or more, such as from about 1 s to about 2000 s, such as from about 1 s to about 1000 s, or from about 1000 s to about 1500 s. In at least one embodiment, the deposition time ranges from $time_1$ to $time_2$ (in units of s) where each of $time_1$ and $time_2$ is independently about 1, about 10, about 30, about 60, about 90, about 120, about 150, about 200, about 240, about 300, about 360, about 420, about 480, about 540, about 600, 660, about 720, about 780, about 840, about 900, about 960, about 1000, about 1020, about 1080, about 1140, about 1200, about 1260, about 1320, about 1380, about 1440, about 1500, about 1560, about 1620, about 1680, about 1740, about 1800, about 1860, about 1920, about 1980, or about 2000, so long as $time_1<time_2$.

A thickness of the carbon-containing layer formed can be about 25 Angstroms (Å) or more, such as from about 50 Å to about 50,000 Å, such as from about 100 Å to about 25,000 Å. In at least one embodiment, the thickness of the carbon-containing layer ranges from $thickness_1$ to $thickness_2$ (in units of Å) where each of $thickness_1$ and $thickness_2$ is independently about 50, about 100, about 200, about 300, about 500, about 1,000, about 2,000, about 3,000, about 4,000, about 5,000, about 6,000, about 7,000, about 8,000, about 9,000, about 10,000, about 10,000, about 11,000, about 12,000, about 13,000, about 14,000, about 15,000, about 16,000, about 17,000, about 18,000, about 19,000, about 20,000, about 21,000, about 22,000, about 23,000, about 24,000, about 25,000, about 26,000, about 27,000, about 28,000, about 29,000, about 30,000, about 31,000, about 32,000, about 33,000, about 34,000, about 35,000, about 36,000, about 37,000, about 38,000, about 39,000, about 40,000, about 41,000, about 42,000, about 43,000, about 44,000, about 45,000, about 46,000, about 47,000, about 48,000, about 49,000, or about 50,000, so long as $thickness_1<thickness_2$.

A deposition rate of the carbon-containing layer can be about 1 Angstroms per minute (Å/min) or more, such as from about 1 Å/min to about 5,000 Å/min, such as from about 10 Å/min to about 3,000 Å/min, such as from about 100 Å/min to about 2,000 Å/min. In at least one embodiment, the deposition rate of the carbon-containing layer ranges from $DR_1$ to $DR_2$ (in units of Å/min) where each of $DR_1$ and $DR_2$ is independently about 1, about 10, about 50, about 100, about 200, about 300, about 400, about 500, about 600, about 700, about 800, about 900, about 1,000, about 1,100, about 1,200, about 1,300, about 1,400, about 1,500, about 1,600, about 1,700, about 1,800, about 1,900, about 2,000, about 2,100, about 2,200, about 2,300, about 2,400, about 2,500, about 2,600, about 2,700, about 2,800, about 2,900, about 3,000, about 3,100, about 3,200, about 3,300, about 3,400, about 3,500, about 3,600, about 3,700, about 3,800, about 3,900, about 4,000, about 4,100, about 4,200, about 4,300, about 4,400, about 4,500, about 4,600, about 4,700, about 4,800, about 4,900, or about 5,000 so long as $DR_1<DR_2$.

In some embodiments, the carbon-containing layer deposited has at least 10% sp$^3$-hybridized atoms as determined by Raman spectroscopy. That is, the sp$^3$-hybridized content of the carbon-containing layer can be at least 10%. The sp$^3$-hybridized content can be from about 1% to about 100%, such as from about 5% to about 90%, such as from about 10% to about 75%, such as from about 25% to about 50% or at least about 60%. In at least one embodiment, the sp$^3$-hybridized content of the carbon-containing layer ranges from $content_1$ to $content_2$ (in units of %) where each of $content_1$ and $content_2$ is independently about 10, about 15, about 20, about 25, about 30, about 35, about 40, about 45, about 50, about 55, about 60, about 65, about 70, about 75, about 80, about 85, about 90, about 95, or about 100, so long as $content_1<content_2$.

New and improved processes and structures are described herein that overcome one or more deficiencies of conventional methods for forming hardmasks. Embodiments described herein enable, e.g., reduced underlayer damage during hardmask formation and improved adhesion between the hardmask and the substrate. Accordingly, embodiments described herein enable, e.g., improved device performance.

As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including." Likewise whenever a composition, an element or a group of elements is preceded with the transitional phrase "comprising," it is understood that we also contemplate the same composition or group of elements with transitional phrases "consisting essentially of," "consisting of," "selected from the group of consisting of," or "is" preceding the recitation of the composition, element, or elements and vice versa.

For the purposes of this disclosure, and unless otherwise specified, all numerical values within the detailed description and the claims herein are modified by "about" or "approximately" the indicated value, and consider experimental error and variations that would be expected by a person having ordinary skill in the art.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

While the foregoing is directed to embodiments of the present disclosure, other and further embodiments of the disclosure can be devised without departing from the basic scope thereof, and the scope thereof is determined by the claims that follow.

What is claimed is:

1. A process for forming a hardmask on a substrate, comprising:
   introducing the substrate to a processing volume of a plasma-enhanced chemical vapor deposition (PECVD) chamber, the substrate positioned on a substrate support, the substrate support comprising an electrostatic chuck;
   depositing a first carbon-containing layer having a thickness of about 100 Å or less on the substrate while electrostatically chucking the substrate to the substrate support, wherein depositing the first carbon-containing layer comprises:
      flowing a process gas into the processing volume within the PECVD chamber, the process gas comprising a carbon-containing gas; and
      striking a plasma with the process gas by applying a first RF bias power to the electrostatic chuck to deposit the first carbon-containing layer, the first RF bias power being about 200 W to about 500 W; and
   forming the hardmask by depositing a second carbon-containing layer on the first carbon-containing layer while electrostatically chucking the substrate to the substrate support, the second carbon-containing layer having a thickness of about 200 Å or more, wherein depositing the second carbon-containing layer comprises:
      flowing the process gas into the processing volume within the PECVD chamber; and
      applying a second RF bias power to the electrostatic chuck to deposit the second carbon-containing layer, the second RF bias power being about 1,000 W to about 10,000 W.

2. The process of claim 1, wherein the carbon-containing gas comprises or is formed from a carbon-containing compound, and wherein the carbon-containing compound is a substituted or unsubstituted $C_1$-$C_{40}$ hydrocarbon, a substituted or unsubstituted $C_6$-$C_{20}$ aromatic hydrocarbon, a $C_1$-$C_{40}$ halogenated hydrocarbon, or a combination thereof.

3. The process of claim 2, wherein the carbon-containing compound comprises an alkyne.

4. The process of claim 3, wherein the carbon-containing compound comprises acetylene.

5. The process of claim 2, wherein the process gas further comprises a non-reactive gas.

6. The process of claim 5, wherein the carbon-containing compound comprises acetylene and the non-reactive gas comprises helium.

7. The process of claim 1, wherein the first carbon-containing layer, the second carbon-containing layer, or both, is deposited while the substrate is maintained at a temperature from about −40° C. to about 40° C.

8. The process of claim 1, wherein the first carbon-containing layer, the second carbon-containing layer, or both, comprises about 60% or more $sp^3$-hybridized atoms as determined by Raman spectroscopy.

9. The process of claim 1, wherein:
   the first carbon-containing layer is deposited while the processing volume is maintained at a first pressure; and
   the second carbon-containing layer is deposited while the processing volume is maintained at a second pressure, the first pressure being greater than the second pressure.

10. The process of claim 9, wherein the first pressure is about 20 mTorr or more, and the second pressure is about 10 mTorr or less.

11. A process for forming a hardmask on a substrate, comprising:
   positioning the substrate within a processing volume of a plasma-enhanced chemical vapor deposition (PECVD) chamber, the substrate on an electrostatic chuck;
   depositing a first carbon-containing layer having a thickness of about 100 Å or less on the substrate while electrostatically chucking the substrate, wherein depositing the first carbon-containing layer comprises:
      flowing a process gas into the processing volume within the PECVD chamber, the process gas comprising a carbon-containing gas, wherein the carbon-containing gas comprises a carbon-containing compound or the carbon-containing gas is formed from a carbon-containing compound, and wherein the carbon-containing compound is a substituted or unsubstituted $C_1$-$C_{40}$ hydrocarbon, a substituted or unsubstituted $C_6$-$C_{20}$ aromatic hydrocarbon, a $C_1$-$C_{40}$ halogenated hydrocarbon, or a combination thereof;
      operating the processing volume at a first pressure of about 20 mTorr or more; and
      striking a plasma with the process gas by applying a first RF bias power to the electrostatic chuck to deposit the first carbon-containing layer, the first RF bias power being about 200 W to about 500 W; and
   forming the hardmask by depositing a second carbon-containing layer on the first carbon-containing layer while electrostatically chucking the substrate, the second carbon-containing layer having a thickness of about 200 Å or more, wherein depositing the second carbon-containing layer comprises:
      flowing the process gas into the processing volume within the PECVD chamber;
      operating the processing volume at a second pressure of about 0.5 mTorr to about 10 mTorr; and
      applying a second RF bias power to the electrostatic chuck to deposit the second carbon-containing layer, the second RF bias power being about 1,000 W to about 10,000 W.

12. The process of claim 11, wherein the carbon-containing compound comprises an alkyne.

13. The process of claim 11, wherein the process gas further comprises one or more non-reactive gases.

14. The process of claim 11, wherein the first carbon-containing layer, the second carbon-containing layer, or both, is deposited while the substrate is maintained at a temperature from about 40° C. to about 10° C.

15. The process of claim 11, wherein the first carbon-containing layer, the second carbon-containing layer, or both, comprises about 60% or more $sp^3$-hybridized atoms as determined by Raman spectroscopy.

16. A process for forming a hardmask on a substrate, comprising:
  positioning the substrate within a processing volume of a plasma-enhanced chemical vapor deposition (PECVD) chamber, the substrate on an electrostatic chuck;
  depositing a first carbon-containing layer having a thickness of about 100 Å or less on the substrate while electrostatically chucking the substrate, wherein depositing the first carbon-containing layer comprises:
    flowing a process gas into the processing volume within the PECVD chamber, the process gas comprising a carbon-containing gas and a non-reactive gas, wherein the carbon-containing gas comprises or is formed from a carbon-containing compound, the carbon-containing compound comprising a $C_1$-$C_{20}$ substituted or unsubstituted hydrocarbon, and wherein the non-reactive gas comprises He, Ne, Ar, or combinations thereof;
    operating the processing volume at a pressure of about 20 mTorr or more; and
    striking a plasma with the process gas by applying a first RF bias power to the electrostatic chuck to deposit the first carbon-containing layer, the first RF bias power being about 200 W to about 500 W; and
  forming the hardmask by depositing a second carbon-containing layer on the first carbon-containing layer while electrostatically chucking the substrate, the second carbon-containing layer having a thickness of about 200 Å or more, wherein depositing the second carbon-containing layer comprises:
    flowing the process gas into the processing volume within the PECVD chamber;
    operating the processing volume at a pressure of about 0.5 mTorr to about 10 mTorr; and
    applying a second RF bias power to the electrostatic chuck to deposit the second carbon-containing layer, the second RF bias power being about 1,000 W to about 10,000 W,
  wherein the first carbon-containing layer, the second carbon-containing layer, or both, is deposited while the substrate is maintained at a temperature from about -40° C.

17. The process of claim 16, wherein the first carbon-containing layer, the second carbon-containing layer, or both, is deposited while the substrate is maintained at a temperature from about −40° C. to about 10° C.

18. The process of claim 16, the first carbon-containing layer, the second carbon-containing layer, or both, comprises about 60% or more $sp^3$-hybridized atoms as determined by Raman spectroscopy.

19. The process of claim 16, wherein the carbon-containing compound is an alkyne, and the non-reactive gas comprises He.

* * * * *